(12) United States Patent
Dukes

(10) Patent No.: US 6,263,098 B1
(45) Date of Patent: Jul. 17, 2001

(54) DETERMINATION OF FUNCTIONALITY FOR INTEGRATED CIRCUIT MODULES

(75) Inventor: Michael A. Dukes, Wimberley, TX (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/151,842

(22) Filed: Sep. 11, 1998

(51) Int. Cl.[7] ..................................................... G06K 9/00
(52) U.S. Cl. ......................... 382/147; 382/173; 364/490; 364/491; 348/87
(58) Field of Search ..................... 382/147, 8; 364/490, 364/491, 489; 348/87

(56) References Cited

U.S. PATENT DOCUMENTS

| | | | |
|---|---|---|---|
| 4,732,473 | * | 3/1988 | Bille et al. .................. 250/559.07 |
| 5,086,477 | * | 2/1992 | Yu et al. ............................ 382/8 |
| 5,097,422 | * | 3/1992 | Corbin, II et al. ............. 364/488 |
| 5,598,344 | * | 1/1997 | Dangelo et al. ............... 366/488 |
| 5,666,288 | * | 9/1997 | Jones et al. ................... 364/488 |
| 5,818,727 | * | 9/1998 | Sekiguchi ..................... 364/490 |
| 5,878,053 | * | 3/1999 | Koh et al. ..................... 371/22.1 |

* cited by examiner

*Primary Examiner*—Matthew C. Bella
*Assistant Examiner*—Sheela Chawan
(74) *Attorney, Agent, or Firm*—Michael Zelenka; John M. O'Meara

(57) ABSTRACT

A method is disclosed for determining the functionality of circuitry contained within integrated circuit modules. A composite image signal is compiled from signals that each represent the image on one of a plurality of layers that are sequentially exposed across the module. A netlist presenting the components of the circuitry and the interconnections therebetween, is generated from the composite image signal. Components from the netlist are then allocated to specific functions which are compiled to determine the functionality of the circuitry.

2 Claims, 3 Drawing Sheets

DETERMINATION OF FUNCTIONALITY FOR INTEGRATED CIRCUIT MODULES

GOVERNMENT INTEREST

The invention described herein may be manufactured, used, imported, sold and licensed by or for the Government of the United States of America without the payment to me of any royalty thereon.

BACKGROUND OF THE INVENTION

This invention relates to the determination of functionality for integrated circuit (hereinafter IC) modules or boards and more particularly, to an automated method for generating such determinations.

Determinations of functionality for IC modules are very important, such as when patent infringement issues arise or when re-engineering and procurement become necessary due to system upgrades or component obsolescence. Although processes for determining such functionality have been automated to some degree in the prior art, generally speaking they are performed manually from photographs of exposed layers which are etched progressively into the IC modules. Furthermore, no automated process is known in the prior art for generating determinations of functionality for IC modules, with circuit characteristics such as timing expressed therein.

SUMMARY OF THE INVENTION

It is the general object of the present invention to automatically determine the functionality of IC modules.

It is a specific object of the present invention to accomplish the general object with a combination of previously published computer programs.

These and other objects of the present invention are accomplished by imaging sequentially exposed layers which are progressively etched into the IC module. Each layer is individually exposed and a digital signal representing the image displayed thereon, is stored. The stored image signals for all of the layers are then compiled to derive a signal representation of the circuitry disposed within the IC module. This signal representation is processed to define the components in that circuitry and the interconnections extending between those components. These components are then grouped as function blocks which are further grouped until a concise determination of functionality for the IC module is derived.

The scope of the present invention is only limited by the appended claims for which support is predicated on the preferred embodiments set forth hereafter in the following description and the attached drawing.

DESCRIPTION OF THE PREFERRED EMBODIMENTS

Figure 1:
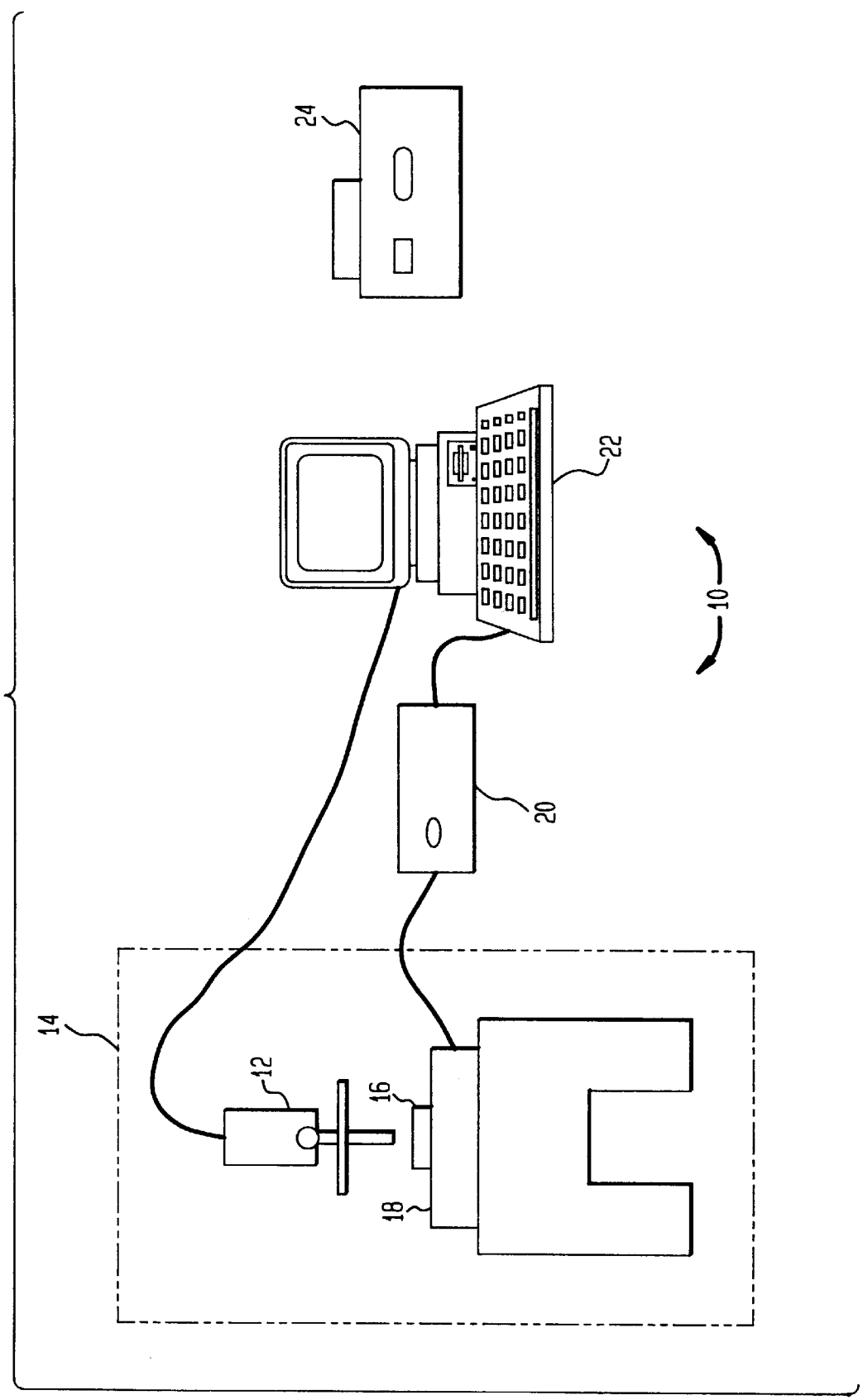
FIG. 1 relates to apparatus with which the preferred embodiments of the invention are accomplished.

This invention relates to an automated process for determining the functionality of IC modules. Apparatus for accomplishing this invention is illustrated in FIG. 1 wherein a microscope 12 having a viewing axis, is disposed at station 14 for imaging the circuit characteristics displayed on exposed planar layers of an IC modules 16. A table 18 for mounting the module 16 is also disposed at station 14 and moves rectilinearly relative to the microscope 12. Movement of the table 18 is regulated by a controller 20 which responds to motion signals received from a computer at station 22.

The planar layers are each disposed perpendicularly across the viewing axis of the microscope 12 and are consecutively exposed using conventional etching techniques, with each exposed layer being individually imaged prior to the subsequent layer being etched. Nitric acid can be utilized to remove the encapsulated IC from any external container prior to etching the layers, which can be readily accomplished with a planar reactive ion etching unit 24, such as is independently disposed in FIG. 1. Stain can be applied to the exposed metal materials on each layer for distinguishing those materials from similar materials in the subsequent underlying layers.

Figure 2A:
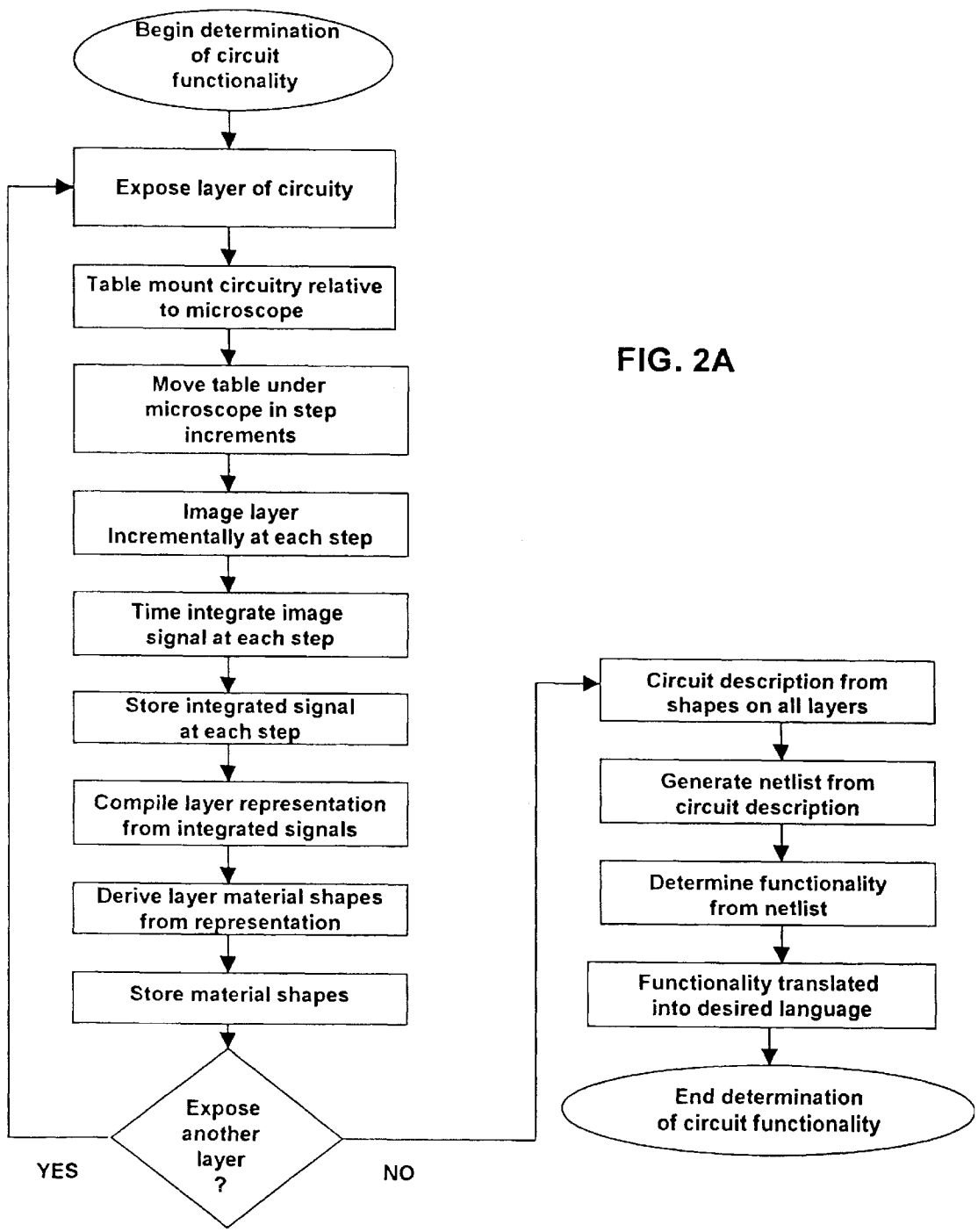
FIG. 2(A) is a method flow diagram for determining circuit functionality.

A digitized image signal passes from the microscope 12 to the computer station 22 which is programmed to process that signal in accordance with the method flow diagram of FIG. 2(A), to thereby generate language that describes the functionality of the IC. The computer programming is compiled from component programs that are directed to particular tasks and have all been published. This programming registers each layer for imaging relative to the rectilinear movement of the table 18 and forwards command signals to the controller 20 for rotating the table 18 to correct any misalignment.

Although each layer could be imaged in full, for the preferred embodiments, command signals are forwarded to the controller 20 for moving the table 18 relative to the microscope 12, in fixed step increments. A frame or incremental portion of the layer being imaged is displayed at each step and to improve the signal-to-noise ratio of the frame signal derived thereat, such signals can be digitized at least twice and averaged with a process known in the art as time-integration. Each frame signal is stored and upon completion of the step increments, the incremental portions are assembled or "corner stitched" together by compiling the stored frame signals, to provide a pixel representation of the total image displayed on the layer.

The programming also includes software which smoothes this pixel representation and segments it into blocks which are configured to represent the formations of various materials on the layer. One version is disclosed in a published report entitled "A MULTIPLE-VALUED LOGIC SYSTEM FOR CIRCUIT EXTRACTION TO VHDL 1076-1987" by Capt. Michael A. Dukes [MS THESIS, AFIT/GE/ENG/88S-1, SCHOOL OF ENGINEERING, AIR FORCE INTSTITUTE OF TECHNOLOGY (AU), WRIGHT-PATTERSON AFB OH, SEPTEMBER 1988 (AD-A202646)]. A block representation is stored for each layer and all such representations are then compiled in their order of etching to provided a composite block representation or comprehensive mask description of the IC. From this mask description, the circuit components in the IC such as the transistors, are identifiable along with the interconnections which exist therebetween and the processes used to fabricate those components.

Figure 2B:
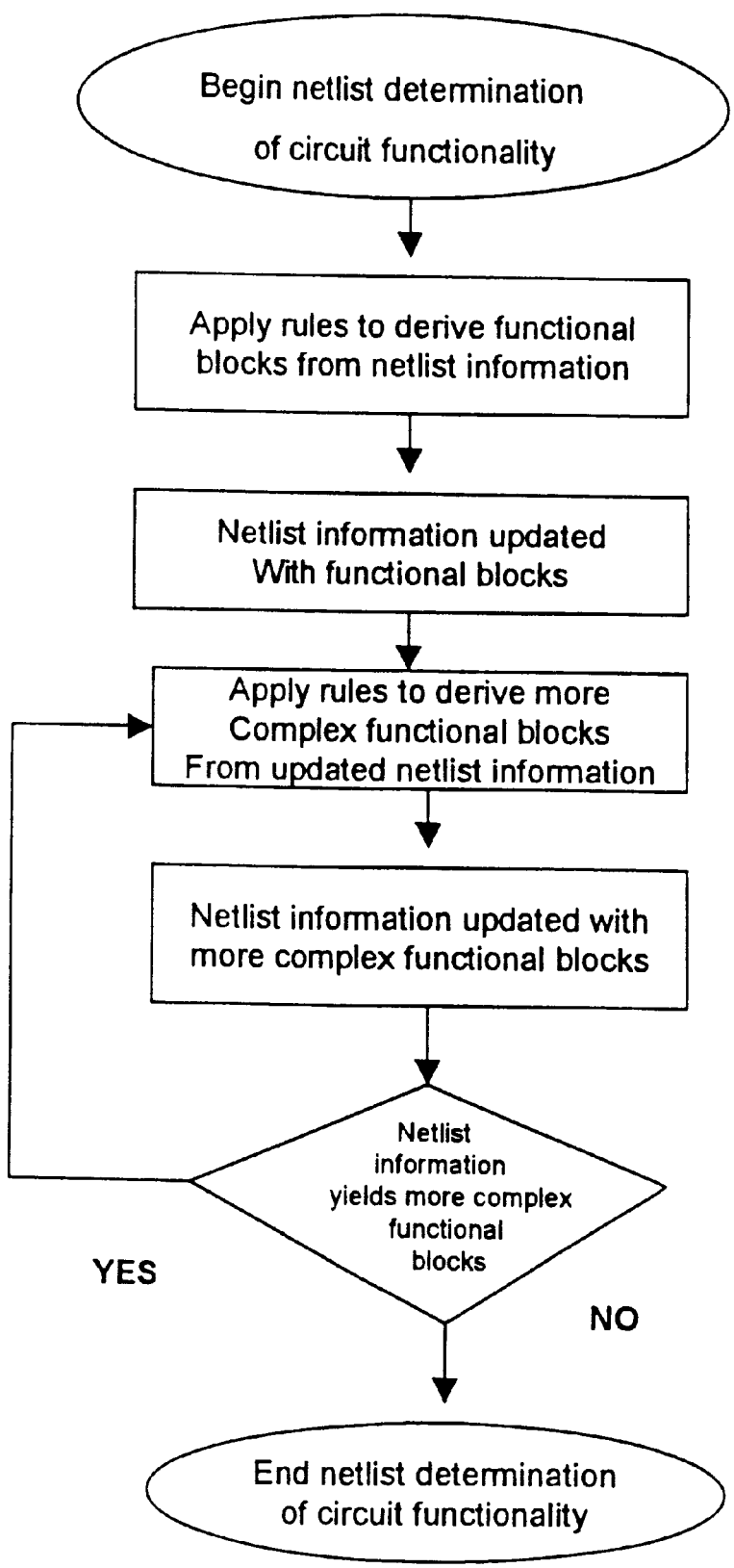
FIG. 2(B) is a method flow diagram for netlist determination of circuit functionality.

Software is incorporated into the programming for generating a list (hereinafter "netlist") of all the circuit components in the comprehensive mask description, and the interconnections existing therebetween. Such software is disclosed in a published report entitled "A GENERALIZED EXTRACTION SYSTEM FOR VLSI" by M. A. Dukes, F. M. Brown and J. E. DeGroat, WRDC Technical Report, July 1987–August 1990 (WRDC-TR-90-5021, Wright R and D Center, Wright-Patterson AFB OH, August 1990). The programming also includes software for combining the circuit components from the netlist into function blocks, with such blocks then being combined into more sophisticated function blocks and so on, until the specific functional nature of the IC is ultimately defined. A version of such software is disclosed in a published report entitled "A PROLOG SYSTEM FOR CONVERTING VHDL-BASED MODELS TO GENERALIZED EXTRACTION SYSTEM (GES) RULES" by M. A. Dukes, F. M. Brown, and J. E. DeGroat, WL Technical Report, June 1990–December 1990 (WL-TR-91-5018, Wright Laboratory, Wright-Patterson AFB OH, June 1991). This software operates in accordance with the method flow diagram of FIG. 2(B) and initially applies a set of rules in identifying specifically interconnected circuit components on the netlist as functional blocks and replaces those interconnected circuit components on the netlist with those functional blocks. For example, a group of interconnected transistors may be identified as an array of digital logic gates. Thereafter, such rules are iteratively applied relative to the netlist in identifying function blocks of greater complexity, for example an array of digital logic gates may be identified as half adders. Once the functionality of the IC has been determined with the computer programming, software therein is applied to translate that functionality into the desired language.

Those skilled in the art of upgrading and maintaining electronic systems will appreciate without any further explanation that within the concept of this invention, many modifications and variations are possible to the above disclosed embodiments of the inventive process. Consequently, it should be understood that all such variations and modifications fall within the scope of the following claims.

What I claim is:

1. A method for determining the functionality of circuitry contained in an IC module from images presented across the module on a plurality of planar layers that are consecutively exposed by etching, with each exposed layer being individually imaged prior to the subsequent layer being etched, comprising the steps of:

mounting the circuitry on a moveable table with its exposed layer registered relative to table movement and to a signal generating microscope;

moving the table relative to the microscope in fixed step increments;

imaging an incremental portion of the layer with the microscope at each table step;

time integrating the image signal of each incremental portion of the layer to improve the signal-to-noise ratio;

storing the time integrated image signal for each incremental portion of the layer;

compiling the stored time integrated image signals of the incremental portions to derive a pixel representation for the total image displayed on the layer;

segmenting the pixel representation into blocks which are configured to represent the formations of various materials on the layer;

storing the block configurations for each layer;

compiling the block configurations for all of the layers in their order of etching to derive a comprehensive mask description of the circuitry;

generating a netlist from the comprehensive mask description, which includes all the components in the circuitry and the interconnections existing therebetween;

compiling the determination of functionality from conventional combinations of the components on the netlist; and translating the determination of functionality into a desired language.

2. A method for determining the functionality of circuitry contained in an IC module from images presented across the module on a plurality of planar layers that are consecutively exposed by etching, with each exposed layer being individually imaged prior to the subsequent layer being etched, comprising the steps of:

mounting the circuitry on a moveable table with its exposed layer registered relative to table movement and to a signal generating microscope;

moving the table relative to the microscope in fixed step increments;

imaging an incremental portion of the layer with the microscope at each table step;

time integrating the image signal of each incremental portion of the layer to improve the signal-to-noise ratio;

storing the time integrated image signal for each incremental portion of the layer;

compiling the stored time integrated image signals of the incremental portions to derive a pixel representation for the total image displayed on the layer;

segmenting the pixel representation into blocks which are configured to represent the formations of various materials on the layer;

storing the block configurations for each layer;

compiling the block configurations for all of the layers in their order of etching to derive a comprehensive mask description of the circuitry;

generating a netlist from the comprehensive mask description, which includes all the components in the circuitry and the interconnections existing therebetween;

applying rules to group the interconnected circuit components on the netlist as functional blocks;

substituting the functional blocks on the netlist for the interconnected circuit components represented thereby;

applying rules to group the functional blocks on the netlist as functional blocks of greater complexity;

substituting the greater complexity functional blocks on the netlist for the lesser complexity functional blocks represented thereby;

repeating the consecutive steps of applying rules to group the functional blocks on the netlist as functional blocks of greater complexity and substituting the greater complexity functional blocks on the netlist for the lesser complexity functional blocks represented thereby, until no further grouping of functional blocks occurs; and translating the determination of functionality into a desired language.

* * * * *